(12) United States Patent
Jonke et al.

(10) Patent No.: US 7,330,773 B2
(45) Date of Patent: Feb. 12, 2008

(54) MULTIPLE INSERTION HEAD

(75) Inventors: Gerhard Jonke, Gilching (DE);
Reinhard Pittschellis, Deizisau (DE);
Rudolf Schmid, Eichenau (DE); Uwe Stadler, Olching (DE); Michele Trigiani, München (DE)

(73) Assignee: Siemens AG, München (DE)

( * ) Notice: Subject to any disclaimer, the term of this patent is extended or adjusted under 35 U.S.C. 154(b) by 0 days.

(21) Appl. No.: 10/541,352

(22) PCT Filed: Jan. 19, 2004

(86) PCT No.: PCT/EP2004/000352

§ 371 (c)(1),
(2), (4) Date: Jul. 5, 2005

(87) PCT Pub. No.: WO2004/066700

PCT Pub. Date: Aug. 5, 2004

(65) Prior Publication Data

US 2006/0048378 A1    Mar. 9, 2006

(30) Foreign Application Priority Data

Jan. 24, 2003    (DE)    ................................ 103 02 802

(51) Int. Cl.
*G06F 19/00*    (2006.01)
*H05K 3/30*    (2006.01)

(52) U.S. Cl. ....................................... 700/159; 29/832

(58) Field of Classification Search ........ 700/159–160, 700/121; 29/832, 834, 836, 837, 740, 743, 29/744

See application file for complete search history.

(56) References Cited

U.S. PATENT DOCUMENTS

| | | | |
|---|---|---|---|
| 4,979,286 A * | 12/1990 | Nakayama et al. | ........... 29/740 |
| 5,313,401 A | 5/1994 | Kasai et al. | |
| 5,588,195 A * | 12/1996 | Asai et al. | ................. 29/33 M |
| 6,247,226 B1 | 6/2001 | Lundberg et al. | |
| 6,640,431 B1* | 11/2003 | Yoriki et al. | .................. 29/834 |
| 6,665,928 B2* | 12/2003 | Suhara | ........................ 29/834 |
| 2001/0002509 A1* | 6/2001 | Suhara | ........................ 29/834 |
| 2003/0059194 A1* | 3/2003 | Trzecieski | .................. 385/137 |
| 2004/0074085 A1* | 4/2004 | Gieskes et al. | ................ 29/743 |

FOREIGN PATENT DOCUMENTS

DE    196 541 72 A1    7/1997

(Continued)

OTHER PUBLICATIONS

Derwent Abstract—DE 10127735 A1 Jan. 16, 2003 Siemens Dematic Aktiengesellschaft, 90475 Nürnberg, Germany.
Derwent Abstract—EP-03 15 799; May 17, 1989; Siemens Aktiengesellschaft, D-8000 München (Germany).

(Continued)

*Primary Examiner*—Zoila Cabrera

(57) ABSTRACT

The invention relates to a multiple insertion head for mounting components onto substrates, the insertion head including a carrier which is arranged in such a way that it can rotate about a rotational axis and is provided with many receiving tools that are arranged in such a way that they can be displaced in a mounting direction at an angle to the rotational axis, the receiving tools being used to receive the components. Each receiving tool is provided with at least one active drive and/or sensor, ensuring that the components are rapidly positioned with the highest precision.

18 Claims, 2 Drawing Sheets

FOREIGN PATENT DOCUMENTS

| | | |
|---|---|---|
| DE | 10127735 A1 | 1/2003 |
| EP | 031 57 99 B1 | 5/1989 |
| EP | 103 22 51 A2 | 8/2000 |
| WO | WO 99/53741 A1 | 10/1999 |

OTHER PUBLICATIONS

Derwent Abstract—DE-196 541 72; Jul. 3,1997; Sony Corp., Tokio/Tokyo (Japan).

* cited by examiner

MULTIPLE INSERTION HEAD

The invention relates to a multiple insertion head for mounting components onto substrates.

BACKGROUND OF THE INVENTION

Such insertion heads are used particularly in devices for mounting printed circuit boards with components, said insertion head comprising at least one multiple insertion head which can be rotated and is provided with a plurality of tools to carry components. Devices for mounting are used mainly in SMD technology.

Within the scope of automatic placement systems for electrical components, the so-called "pick-and-place" method is in widespread use. Said method implies that the components are picked up individually, centred and positioned and mounted individually onto printed circuit boards or substrates. Such a process is carried out for each individual component.

Multiple insertion heads for the "pick-and-place" method are for example known from DE 19654172 as well as from EP 315799. Both the above-mentioned documents in each case publish at least one multiple insertion head which can be rotated and is provided with a plurality of receiving tools for components. In order to be able to carry out the processes such as receiving, centring and positioning required for the "pick-and-place" method, the respective receiving tools of the well-known multiple insertion heads are in each case arranged in such a way that they can be moved in and against a mounting direction and also positioned in such a way that they can rotate about a rotational axis.

For a correct positioning of the electrical components to be mounted, a precise angle alignment of the components with the receiving tools is required because otherwise incorrect mounting takes place.

For this after receiving the component in the receiving tool, this component is rotated by means of an external device until the component to be mounted is in the predetermined angle position in the receiving tool. For that, in the case of the known multiple insertion head, a rotational device is required which is coupled from the outside to the receiving tools and uncoupled again after the rotation.

In addition, in the case of the known multiple insertion heads, a vacuum is often used in order to keep the components to be mounted in the receiving tools. The vacuum required for this is generated outside the insertion head and conveyed through vacuum lines up to the top parts of the receiving tools. This requires a high vacuum because the lines are very long.

SUMMARY OF THE INVENTION

Therefore, it is the object of the invention to create a multiple insertion head ensuring that the electrical components are rapidly positioned with the highest precision onto substrates. This object of the invention is solved according to the invention by a multiple insertion head with the features according to claim 1. Preferred embodiments of the invention are given in the dependent claims.

According to the invention, a multiple insertion head for mounting components onto substrates is created comprising a carrier which is arranged in such a way that it can rotate about a rotational axis and is provided with a plurality of receiving tools that are arranged in such a way that they can be moved in a mounting direction at an angle to the rotational axis; said receiving tools being used to receive the components. Each receiving tool is provided with at least one active drive and/or sensor.

This makes it possible to mount components independently of external actuators, as a result of which the mounting precision is improved considerably because a coupling or uncoupling of the external actuators is not necessary.

In particular, each receiving tool is provided with its own rotary drive as the active drive by means of which the received components can in each case be rotated about a tool axis arranged at an angle to the rotational axis of the carrier. The rotary drive can, for example, be provided in a unit together with a sensor by means of which the rotation of the rotary drive and with that the rotation of the component to be mounted can be detected. That is how a closed loop control circuit for the rotary motion of the component to be mounted is created. Because coupling or uncoupling processes are not required, angle errors of the rotation of the component to be mounted connected with this, also do not occur. In addition, the time involved in coupling or uncoupling an external actuator can be saved.

According to the invention, each receiving tool can have a vacuum generator as the active drive for holding the components in the receiving tools which is, in particular, embodied as a Venturi tube. In this case, the carrier is provided with a hollow shaft which runs coaxially to the rotational axis and to which the receiving tools are fitted. Compressed air can be conveyed through the hollow shaft of the carrier to the Venturi tubes so that the vacuum required for receiving and holding the components to be mounted in the receiving tools can be generated. This offers the advantage that only very short vacuum lines are required between the vacuum generator and the receiving tool as a result of which vacuum losses are avoided and a constant vacuum level is made possible in the respective receiving tools. In addition, the separate vacuum supply of the respective receiving tools offers the advantage that when a component drops from a receiving tool; the vacuum level in the remaining receiving tools does not change.

In addition, the atmospheric air pressure can be adapted by means of a uniform compressed air supply to all the receiving tools. This involves the compressed air supply of the vacuum generator of the receiving tools being provided with a proportional valve by means of which the supply pressure can be adjusted depending on the atmospheric pressure. The higher the atmospheric air pressure, the lower the selection of the supply air pressure. The result is that the air consumption is considerably reduced especially at sea level. In addition, the mounting reliability is improved by a constant air pressure and thereby a constant vacuum level in the receiving tools.

In addition, according to the invention the multiple insertion head can have a blast air vacuum device which makes possible to supply receiving tools, in a receiving mounting position of the carrier, with a vacuum when receiving the components and, when mounting the components, with a blast air impulse. Because of this, using a vacuum level in the receiving tools which is suitable for receiving the components is possible on the one hand and, on the other hand, an accelerated mounting of the components to be mounted by means of a blast air impulse is possible.

The blast air vacuum device can, for example, have a Venturi tube whose exit on the air outlet side can be closed by means of a valve. When the air outlet side of the Venturi tube is closed for a short while, a vacuum is not generated, but a blast air impulse is output. In addition, a pressure sensor can be provided in this case which makes possible a regulated closing of the air outlet side of the Venturi tube so that the pressure level can be set as desired.

The receiving tools for example have a tool shaft embodied as a hollow shaft which runs coaxially to the tool axis. The applied vacuum or blast air impulse can be conveyed through this hollow shaft to the distal end area of the tool shafts by means of the vacuum generator provided in the receiving tool and/or by means of the blast air vacuum device in the receiving tool. Here, vacuum pipettes are provided which, for example, suck in the components which are to be mounted.

Because the carrier is fitted to the multiple insertion head in such a way that it can rotate, a rotationally symmetrical energy and data transmission device is required by means of which the active drives and/or sensors can be supplied with energy as well as by means of which the data of the sensors can be transmitted. In this case, a first transmitter part is permanently fitted to the housing of the multiple insertion head and a second transmitter part is permanently fitted to the carrier which can rotate. The energy and data transmission device is for example provided with at least one slip ring by means of which both energy and data can be transmitted. However, it is also for example possible in each case to provide one pair of electrical inductive transmitters and one pair of capacitive transmitters which are in each case arranged rotationally symmetrical around the rotational axis of the multiple insertion head and by means of which both the energy and the data can be transmitted without contact. This offers the advantage of a wear-free energy and data transmission.

In this case the capacitive transmitter is, in particular, embodied as a plate-shaped antenna in each case in the first transmitter part and in the second transmitter part. In the first transmitter part the electromagnetic transmitter can have a circular magnetically conductive body with a u-shaped cross section open in the direction of the carrier as well as in the second transmitter part a circular magnetically conductive body with, in essence, a rectangular cross section which is arranged in such a way in the opening of the first transmitter part that the direction of the magnetic field used for the transmission of energy is, essentially, at right angles to the direction of the electrical field used for the transmission of data. This offers the advantage of a compact-design non-contact energy and data transmission in which there is essentially no interference field.

On the housing of the multiple insertion head as well as on the carrier, polished disks can in each case be provided such that a rotationally symmetrical transmission of compressed air and a vacuum is possible in all the positions of the receiving tools or in selected positions of the receiving tools. A selected position of the receiving tools is for example the receiving mounting position.

On the carrier at least one control unit can be provided by means of which the active drives or sensors can be controlled. For this purpose, a signal processor can be used in each case for one or a plurality of the active drives or sensors.

This allows decentralized processing of control data or sensor data, with the amount of data to be transmitted via the rotationally symmetrical energy and data transmission device being reduced. Consequently, the speed of the multiple insertion head can be increased.

In order to make it possible for the receiving tools to move in the mounting direction, a linear motor is for example provided as the linear drive by means of which each receiving tool is engaged and which is in the receiving mounting position. Consequently, the receiving tool in the receiving mounting position can be moved by means of the linear motor in the mounting direction.

Using a linear motor for moving the component to be mounted in the mounting direction offers the advantages of a more precise positioning, reducing the moved mass as well as shorter displacement times.

In the multiple insertion head, additional retracting means can be provided by means of which the rotor of the linear motor is pretensioned by a spring tension against the force of gravity and in the case of which this pretensioning is compensated for by means of compressed air when operating the insertion head. Because of this it is ensured that in the case of a power supply interruption, the rotor of the linear motor does not slide down in an uncontrollable manner allowing damage to the multiple insertion head to be avoided as the multiple insertion head is moved over the mounting plane.

For example, the rotational axis of the multiple insertion head must be arranged at an angle to the mounting plane so that the receiving tool located at the mounting position is arranged at right angles to the mounting plane. Because of the cone-shaped arrangement of the receiving tools in the multiple insertion head it is possible to arrange a component camera in such a way that it is opposite and facing the mounting position and that a subarea of the optical system of the component camera can be positioned below the components received in the receiving tool in the mounting position. Because of this it is possible to determine both the correct position of the received component in the receiving tool and the height of the component.

The invention is described in more detail with reference to the drawings. They are as follows:

DETAILED DESCRIPTION OF THE INVENTION

Figure 1:
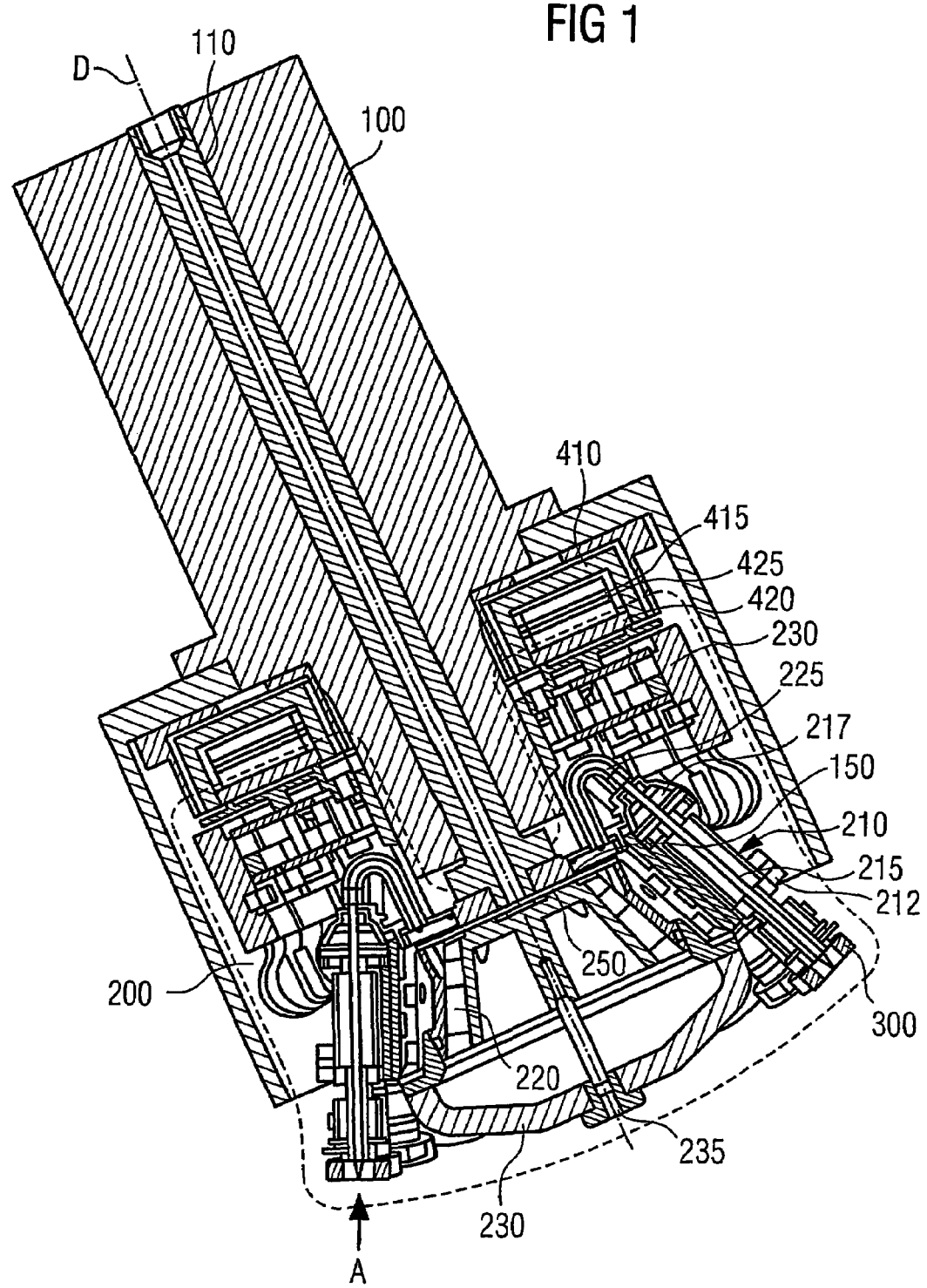
FIG. 1 a sectional view from the side of a preferred embodiment of the multiple insertion head according to the invention, and FIG. 2 a partly perspective view of the preferred embodiment of the multiple insertion head according to the invention.
Figure 2:
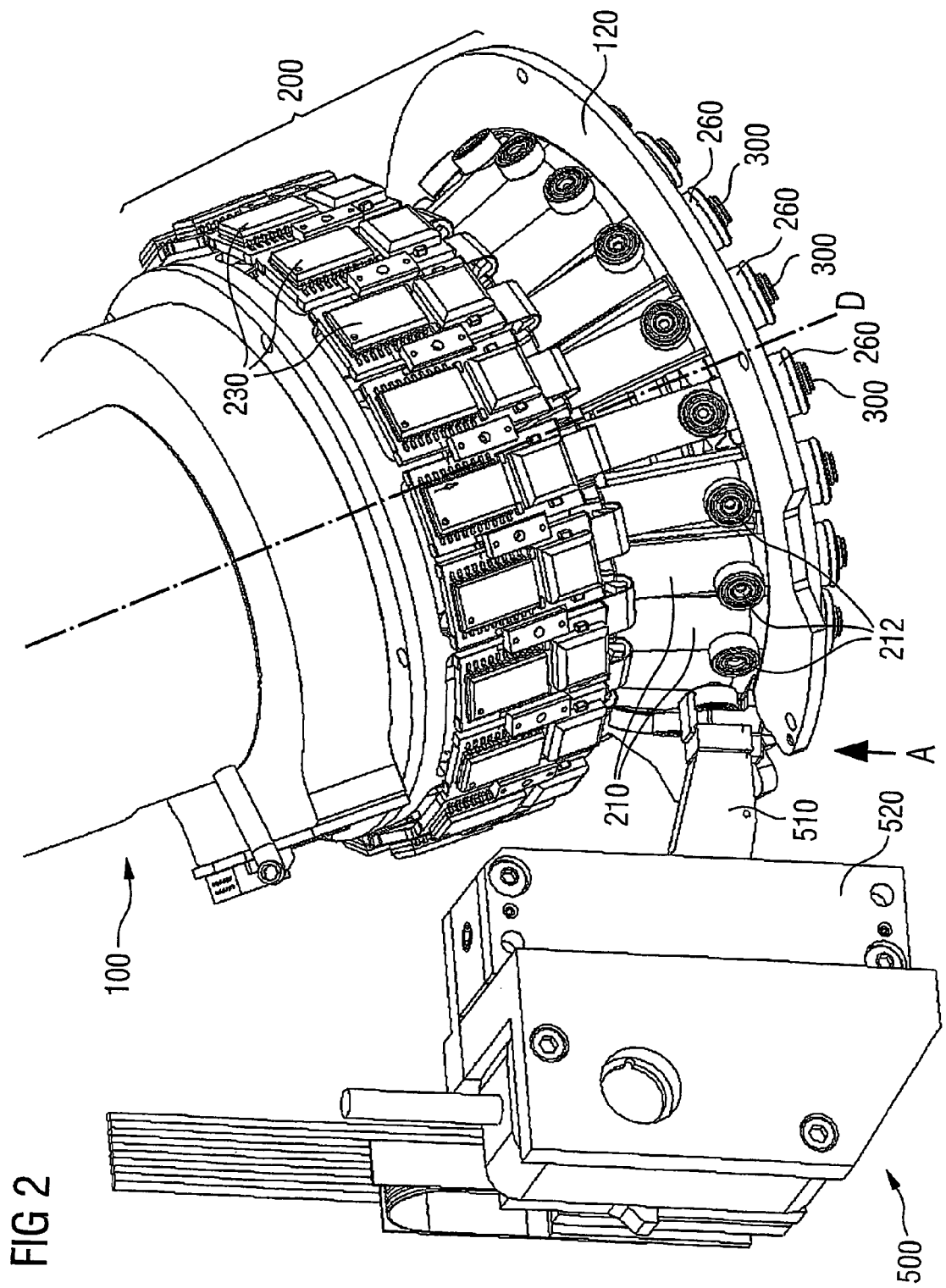

As can be seen in FIGS. 1 and 2, a preferred embodiment of the multiple insertion head according to the invention has a rotary drive 100 with a drive shaft 110 which runs along the rotational axis D of the carrier 200 according to the preferred embodiment. In the connecting area of the carrier 200 in the drive shaft 110, at least one pair of polished disks 150, 250 is provided. In this case, the polished disk 150 is connected with the housing of the rotary drive 100. The polished disk 250 is fitted to the side of the carrier 200 facing the rotary drive 100 in order to be able to forward the compressed air fed through the drive shaft 110 to one or a plurality of the receiving tools 210. In order to be able to forward compressed air through the drive shaft 110 to the receiving tools 210, the drive shaft 110 is embodied as a hollow shaft as can be seen in FIG. 1.

In addition, openings are made in the top side of the polished disk 250 on the air outlet side through which compressed air can be conveyed separately on the carrier 200 for each receiving tool in order to be able to generate a vacuum for the specific receiving tool 210 by means of its vacuum generator. In this case, the carrier for each receiving tool 210 has a Venturi nozzle 220 which is supplied with compressed air through the drive shaft 110 and the polished disks 150 and 250 in order to generate a vacuum and to be able to forward this to the respective tool shafts 215.

In the end range of the carrier 200 away from the rotary drive 100, a cap 235 is provided by means of which the spent air of a plurality of Venturi nozzles 220 is diverted and conveyed for cooling past the receiving tools 210. This allows a separate cooling apparatus for cooling the rotary drives in the receiving tools 210 to be dispensed with.

The carrier i, essentially designed rotationally symmetrical and has a truncated cone-shaped body in which case in the peripheral area of the truncated cone, the receiving tools 210 are fitted in such a way that they are distributed uniformly. In each case, by means of a linear guide, each receiving tool 210 is arranged in such a way that it can be moved linearly in the mounting direction which is tangential to the peripheral area of the carrier 210. The receiving tools 210 are in each case provided with an engaging element 212 which is in each case supported in a race 120 arranged concentrically to the rotational axis D.

The race 120 is permanently fitted to a housing of the multiple insertion head so that it can be used as the circular guide for the receiving tools 210. In a receiving mounting position A, the race 120 is interrupted for the width of the engaging element 212. This allows a linear drive 500 with an engaging piece 510, provided on the housing of the multiple insertion head, which is permanently fitted to its runner 520 to engage in the engaging element 212 and the corresponding receiving tool which is in the receiving mounting position (A) to move linearly in the mounting direction in order to take components 300 from the feeding devices and/or for positioning components 300 onto substrates. The components 300 are for example sucked in the vacuum pipettes 260 by means of a vacuum, which are fitted in the receiving tools 210 to their distal end area in each case.

Each receiving tool 210 has a tool shaft 215 embodied as a hollow shaft to which the vacuum pipette 260 is fitted. Here, the vacuum pipette 260 is in each case arranged both flexible and vacuum-tight in the receiving tool 210 in the direction of the tool axis of the tool shaft 215. In addition, each receiving tool has its own electrical rotary drive 228 which is connected with the tool shaft 215 as well as an angle sensor 217 for the rotary drive 228. The angle sensor 217 together with the rotary drive 228 and an evaluation electronics system 230 which is likewise fitted to the carrier 200, form a closed-loop control circuit for detecting the rotations of the vacuum pipettes 260 and consequently the components 300.

According to the preferred embodiment of the invention, to transmit energy and data between the housing of the multiple insertion head and the carrier 200, on the one hand, one or a plurality of slip rings can be provided between the rotary drive 100 and the carrier 200 (not shown).

However, it is also possible for a non-contact energy and data transmission to be provided between the rotary drive 100 and the carrier 200. In this case, as can be seen in FIG. 1, in the rotary drive 100, a first transmitter part is arranged with a circular body of a magnetically conductive material 410 with a u-shaped cross-section in which case the hollow section arising as a result of the u-shaped cross section is embodied open towards the carrier 200. In addition, a coil (not shown) is provided which is in electromagnetic interaction with the circular body 410. In addition, a plate-shaped rotationally symmetrical antenna 415 is provided in the rotary drive 100 in the vicinity of the circular body 410, said antenna in any case embodied in ring format.

On the carrier 200, an antenna 425 corresponding to the plate-shaped antenna 415 of drive 100 is provided. In addition, on the carrier in the area facing the rotary drive 100, a second transmitter part is provided with a circular magnetically conductive body 420 with a rectangular cross section which, in the hollow section brought about by the u-shaped cross section of the circular body 410 together with the plate-shaped antenna 420 relative to the rotary drive 100, is fitted in such a way that it can rotate and also permanently to the carrier 200. In addition, on the carrier 200, a coil (not shown) is provided which is in electromagnetic interaction with the circular body 420.

Consequently, independent of the rotary motion of the carrier 200 relative to the rotary drive 100, it is at any time possible to transmit energy from the rotary drive 100 to the carrier 200 via the coils and the circular body 410 or 420. In addition, independent of the rotation of the carrier 200 relative to the rotary drive 100, data can likewise be exchanged in both directions between the rotary drive 100 and the carrier 200 via the two antennas 415 or 425.

The transmitted data and energy are used for activating the rotary drives of the receiving tools 210 connected with the rotary drives of the receiving tools and the rotary sensors 217 of the receiving tools 210. For this purpose, a control unit 230 is for example provided for each receiving tool 210, said control unit having a digital signal processor in particular. However, it is also possible to provide on the carrier 200 only one or a limited number of control units 230 and in each case to control a plurality of receiving tools 210 or all the receiving tools 210 by a single digital signal processor.

In the receiving mounting position A in which the receiving tool 210 located there can be moved by means of the engaging element 212 in the mounting direction by the linear drive 500, it is also possible by means of a polished disk (not shown) permissible in this position for the specific receiving tool 210 on the carrier 200; said polished disk being arranged between the rotary drive 100 and the carrier 200, to feed in addition a vacuum or compressed air through the vacuum lines 225.

For this, an additional vacuum generator is used (not shown) which, in the receiving mounting position, is connected via the additional polished disk with the vacuum line 225 of that receiving tool 210 which is in the receiving mounting position. This additional vacuum generator can for example be a Venturi tube which on the air outlet side can be closed by means of a proportional valve. By opening the valve to different degrees, the vacuum level can be set on the receiving tool 210 as desired.

This enables components 300 to be fetched safely from the feed devices (not shown). For this purpose, the multiple insertion head with the vacuum pipette 260 of the receiving tool 210 located in the receiving mounting position moves over the component 300 to be removed in the feeding device and subsequently lowered by means of the linear drive onto the component 300. Switching on the additional vacuum makes it possible for the component to be removed safely.

When the received components 300 are placed, the additional vacuum generator in the receiving mounting position makes it possible to send a compressed air impulse to the receiving tool 210 located in the receiving mounting position over which the applied vacuum is blown so that the component 300 to be, mounted is pushed away from the receiving tool 210 onto a substrate (not shown) to be mounted.

The invention claimed is:

1. A multiple insertion head for mounting components onto substrates, comprising:
   a carrier arranged such that it can rotate about a rotational axis;
   a plurality of active drives; and
   a plurality of receiving tools arranged such that they can be moved in a mounting direction at an angle to the rotational axis, the receiving tools being arranged on the carrier and arranged so as to receive the components, wherein each receiving tool is permanently coupled to one of the active drives, wherein each receiving tool is configured to be moved and controlled individually, and wherein components can be mounted independently of external actuators.

2. The multiple insertion head according to claim 1, wherein each receiving, tool comprises its own rotary drive by means of which received components can each be rotated about a tool axis arranged at an angle with respect to a rotational axis of the multiple insertion head.

3. The multiple insertion head according to claim 1, wherein each receiving tool comprises a vacuum generator.

4. The multiple insertion head according to claim 3, wherein the vacuum generator comprises a Venturi tube and the carrier comprises a hollow shaft running coaxially to the rotational axis to which the receiving tools are fitted such that compressed air can be conveyed through the hollow shaft of the carrier to the Venturi tube.

5. The multiple insertion head according to claim 3, wherein the Venturi tube is connected to a regulator to control pressure.

6. The multiple insertion head according to claim 1, further comprising a blast air vacuum device arranged in a receiving mounting position of one of the receiving tools, the vacuum device further arranged such that therein components can be received or mounted by means of the receiving tool located in the receiving mounting position, the receiving tool being connected such that an additional vacuum can be applied or generated to the receiving tools for receiving the components or in addition a blast air impulse while mounting the components in the receiving tool located in the receiving mounting position.

7. The multiple insertion head according to claim 1, wherein each receiving tool comprises a tool shaft embodied as a hollow shaft running coaxially to the tool axis and a rotary sensor arranged so as to detect an angle position of the tool shaft.

8. The multiple insertion head according to claim 7, wherein each tool shall comprises a vacuum pipette at a distal end range.

9. The multiple insertion head according to claim 7, further comprising a rotationally symmetrical energy and data transmission device arranged between the carrier and a housing of the multiple insertion head, the transmission device arranged such that the active drives and the sensors can be supplied with energy and by which the data from the sensors and the data to the sensors can be transmitted with a first transmitter part being permanently fitted to the housing of the multiple insertion head and a second transmitter part being permanently fitted to the carrier in such a way that it can rotate.

10. The multiple insertion head according to claim 9, wherein the transmission device comprises at least one slip ring.

11. The multiple insertion head according to claim 9, wherein the data transmission device comprises one pair of electromagnetic transmitters and one pair of capacitive transmitters arranged rotationally symmetrical around the rotational axis of the multiple insertion head and by means of which there is non-contact transmission of both the energy and the data.

12. The multiple insertion head according to claim 11, wherein the capacitive transmitter comprises a plate-shaped antenna in the first transmitter part and in the second transmitter part, the first transmitter part the electromagnetic transmitter comprises a circular magnetically conductive body with a u-shaped cross section open in the direction of the carrier and a circular magnetically conductive body in the second transmitter part comprising a rectangular cross section which is arranged in such a way in the opening of the first transmitter part that the direction of the magnetic field used for the transmission of energy is at right angles to the direction of the electrical field used for the transmission of data.

13. The multiple insertion head according to claim 9, comprising at least one polished disk arranged on the housing and on the carrier such that the polished disks are arranged immediately next to each other so that compressed air and a vacuum can be applied from external vacuum generators to the active drives of the carrier.

14. The multiple insertion head according to claim 1, wherein the carrier comprises at least one control device arranged so as to control the active drives.

15. The multiple insertion head according to claim 14, wherein the control unit comprises at least one digital signal processor by means of which the active drives can be controlled.

16. The multiple insertion head according to claim 1, further comprising a linear motor arranged such that a receiving tool in the receiving mounting position can be moved in the mounting direction provided that the linear motor is engaged in the receiving tool.

17. The multiple insertion head according to claim 16, further comprising an engaging element provided in each receiving tool so as to engage in an engaging piece of the runner of the linear motor.

18. The multiple insertion head according to claim 16, further comprising a retracting means interacting with the linear motor by means of which a runner of the linear motor is pretensioned by means of a spring tension against the force of gravity and in which the pretensioning is compensated for by compressed air when the insertion head is in operation.

* * * * *